Figure 1:
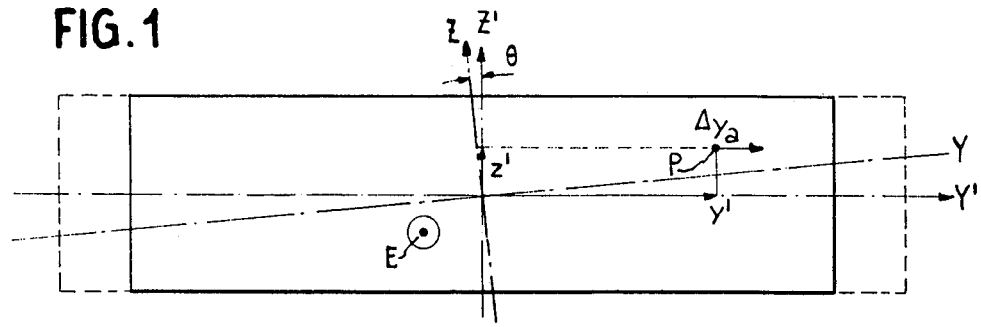
Figure 2:
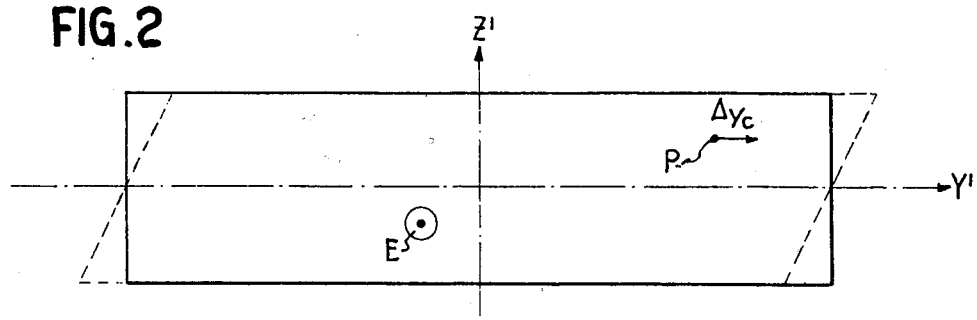

United States Patent [19]

Michel

[11] 4,139,793

[45] Feb. 13, 1979

[54] INTEGRAL RESONANT SUPPORT ARMS FOR PIEZOELECTRIC MICRORESONATORS

[75] Inventor: Jean-Georges Michel, Neuchatel, Switzerland

[73] Assignee: Ebauches S.A., Neuchatel, Switzerland

[21] Appl. No.: 822,334

[22] Filed: Aug. 5, 1977

[30] Foreign Application Priority Data

Sep. 14, 1976 [CH] Switzerland .................. 11645/76

[51] Int. Cl.² ........................................... H01L 41/10
[52] U.S. Cl. .................................. 310/353; 310/367; 310/368
[58] Field of Search .............................. 310/351–353, 310/367, 368

[56] References Cited

U.S. PATENT DOCUMENTS

| | | | |
|---|---|---|---|
| 3,488,530 | 1/1970 | Staudte | 310/367 X |
| 3,581,126 | 5/1971 | Omlin | 310/352 |
| 3,794,867 | 2/1974 | Gibert et al. | 310/352 |
| 3,913,195 | 10/1975 | Beaver | 310/351 X |
| 4,025,806 | 5/1977 | Weber | 310/352 |

FOREIGN PATENT DOCUMENTS 1163732  9/1958  France ................................ 310/352

Primary Examiner—Mark O. Budd
Attorney, Agent, or Firm—Imirie, Smiley & Guay

[57] ABSTRACT

Piezoelectric microresonators with suspension arms, oscillating according to a vibration resulting from the superposition of a principal extensional mode of oscillation, of a first shear coupled mode of oscillation and of a second extensional coupled mode of oscillation. The suspension arms are attached to the active part of the resonator in a place which is the intersection of a nodal plane of the vibration resulting of the superposition of the principal mode and of the first coupled mode of oscillation. The other end of the arms is fixed on a stiff support in a location which coincide with a node of their vibration.

10 Claims, 10 Drawing Figures

INTEGRAL RESONANT SUPPORT ARMS FOR PIEZOELECTRIC MICRORESONATORS

This invention relates to a microresonator comprising a flat resonant part and two suspension arms disposed in parallel to the plane of said resonant part, one of the ends of each of said arms being apt to be fixed on a stiff support and said resonant part being provided on two sides with electrodes to stimulate the vibrations, said electrodes being extended by connection leads associated to said arms.

The problem to be solved is to design a resonator with very small dimensions, more particularly suitable to be used in a electronic watch, such a resonator having a quality factor greater than $10^4$ and being well suited to be batch-manufactured.

A resonator is already known, which satisfies part of these conditions. It comprises a small rectangular plate cut out of a piezoelectric material in such a way that its great faces are perpendicular to the electric X-axis of the material; the great faces are covered with a thin metallic layer used as excitation electrodes; the small plate is fixed on a support by two metallic rods (beryllium copper spikes) soldered to the center of the electrodes, perpendicularly to the faces of the plate; the rods are also used to apply an alternating voltage to the electrodes in order to create an electrical field parallel to the X-axis in order to induce a vibration according to a principal extension longitudinal mode of oscillation.

Such a design, although simple and robust, does not allow a sufficient degree of miniaturisation together with a high quality factor because the area to be soldered becomes prohibitive with regard to that of the small plate. This gives rise to a damping of the vibration. Moreover, the soldering of rods perpendicular to the electrodes, does not facilitate an automatic production and the presence of the rods in a direction perpendicular to the plane of the plates prevents the possibility to reduce the thickness of the resonator.

Another piezoelectric microresonator is also known which comprises a rectangular blade suspended by at least one pair of arms disposed in the plane of the blade; the arms are cut out of the same plate as the blade and have the shape of rectilinear parts, coming out perpendicularly to the great lateral faces of the blade. An alternating voltage is applied to metallic electrodes deposited upon one of the great faces (possibly on both faces) and stimulate a flexure mode of vibration. The arms are attached to the blade at the nodal points of the vibration.

Such a resonator, with small dimensions, is suited to be batch-manufactured but it has a quality factor that is insufficient to be used for time measurement. One may observe in fact that the arms are subjected to a deformation of torsion produced by the flexure mode of vibration of the blade attached to their ends. Under such circumstances, the arms and their stiff fixing on the support play a direct and important part on the quality factor of the resonator.

In order to eliminate the above mentioned disadvantages, the present invention provides a microresonator having a resonant part cut out of a piezoelectric material in such a way as to oscillate according to a vibration resulting from the superposition of a principal extensional mode of oscillation, of a first shear coupled mode of oscillation and of a second extensional coupled mode of oscillation, said resonant part being attached to said arms approximately at the point of intersection of a nodal plane of the vibration resulting of the superposition of said principal mode and said first coupled mode with lateral sides of said resonant part, so that said arms are only bound to vibrate according to said second coupled mode of oscillation, and wherein said fixing of said arms on said stiff support is located at a node of said vibration of said arms.

Several embodiments of the present invention will be described further with reference to the accompanying drawing in which FIGS. 1 to 4 show the different modes of deformation of a blade performing as the active part of the resonator, and FIGS. 5 to 10 show plan views of several embodiments of the invention.

FIG. 1 shows a rectangular plate cut out of a piezoelectric material in such a way that the great sides are perpendicular to the electric X-axis of the material and that the direction Z' of the width of the plate is forming an angle $\theta$ (called cutting angle) with the optical Z-axis. The same angle $\theta$ exists between the direction Y' of the length of the plate and that of the mechanical Y-axis.

The angle $\theta$ is chosen more particularly in function of the temperature range within which the resonator shall be used.

Metallic electrodes are deposited upon each of the great sides of the blade by vacuum evaporation. An alternating voltage applied to the electrodes produces an electrical field parallel to the X-axis. This field produces a complex deformation of the blade, that is a principal extensional longitudinal mode of vibration and secondary modes coupled to the principal one.

FIG. 1 shows in continuous line a plan view of the blade without any electrical field and in dashed line the extensional deformation (deformation are exaggerated in the drawing) produced by the action of the field E which, in this case, points out toward the observer and is arbitrary chosen as positive.

The displacement of a point P in the plane of the blade, due to this deformation is given by $$\Delta y_a = E \cdot K_a \cdot y'$$

where:

E is the intensity of the electrical field $K_a$ is a constant which depends on the piezoelectric coupling factor and on the modulus of elasticity of the material in the direction of the Y'-axis, thus being also dependant on the cutting angle $\theta$, and y' is the abscissa of the point P in the system of coordinates Y'Z' whose origin is at the center of the plate.

The nodal line of this vibration, that is the geometrical locus of the points having null displacement is identical with Z'-axis.

A first coupled mode of deformation is associated to the principal mode: it is a shear mode due to the anisotropic structure of the piezoelectric material. The shearing is illustrated by the dashed line of FIG. 2 where the displacement of the point P, resulting from the action of this secondary mode, is given by $$\Delta y_c = E \cdot K_c \cdot z'$$

where:

E is again the intensity of the electrical field $K_c$ is a constant which depends on the coupling factor of the material, between the extensional deformation and the shear deformation, thus being again dependant on the cutting angle $\theta$ and whose sign is depending on the sense of the cristalline axis, and z' is the ordinate of P The nodal line of the vibration is identical with Y'-axis.

Figure 3:
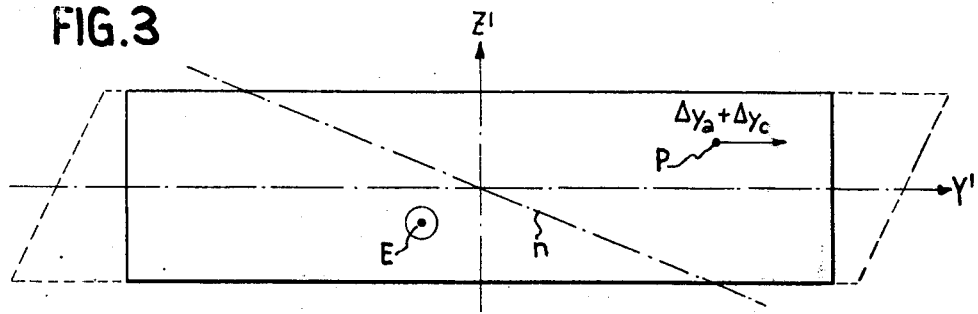

The dashed line of FIG. 3 shows the deformation which results from the superposition of the principal mode and of the first coupled mode. One can see that there exists a geometrical locus of the points for which $\Delta y_a + \Delta y_c = 0$. These points are situated on the straight line determined by $$y' = -(K_c/K_a) \cdot z'$$

This dash-dotted line n of FIG. 3 is the nodal line of the resulting vibration. The amplitude of the vibration is null along this line and the position of the latter is not dependant on the intensity or on the sense of the electrical field applied by the electrodes and is only determined by the characteristics of the material used and by the cutting angle $\theta$.

The physical properties of the piezoelectric materials are such that it exists a second coupled mode of vibration which is an extensional transversal mode in the direction of the Z'-axis.

Due to that vibration, there is a displacement of the points of the resonator in a parallel direction to the Z'-axis, displacement whose value is given by $$\Delta z = E \cdot K_t \cdot z'$$

Where:

E is again the intensity of the electrical field $K_t$ is a constant which depends on the piezoelectric coupling factor and of the modulus of elasticity of the material in the direction of the Z'-axis, thus being also dependant on the cutting angle $\theta$, and z' is again the ordinate of the point into consideration.

Figure 4:
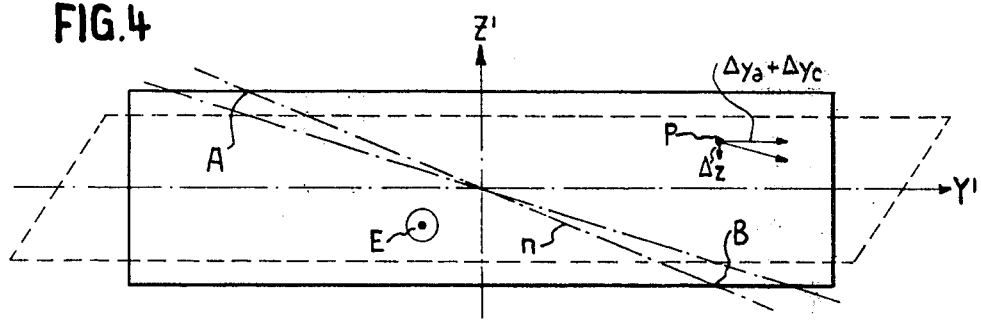

FIG. 4 shows in dashed line the displacement of the points of the resonator under the combined influence of the three modes of vibration described above.

The value of the displacement of the point P is the vectorial sum of the partial displacements, said value being thus equal to $$\Delta y_a + \Delta y_c + \Delta z$$

The points of the nodal line n for which $$\Delta y_a + y_c = 0,$$

and more particularly the points A and B, situated at its intersection with the sides of the blade, have a displacement only in the direction parallel to the Z'-axis.

The basic idea of the invention is to take into account the effects of the coupled modes and to attach suspension arms in the neighbourhood of the intersection of the nodal line (or of the nodal plane if one takes into consideration the thickness of the blade) with the lateral longitudinal sides of the blade. The arms shall then be put into motion by the second coupled vibration only and in only one direction so that it will be possible to provide their embeddement on a support at the location of a node of their vibration. Then, the principal mode of vibration will not be hindered. Such a construction would be difficult to materialize when the arms are submitted to combined deformations, for example flexure-extension or flexure-torsion.

Figure 5:
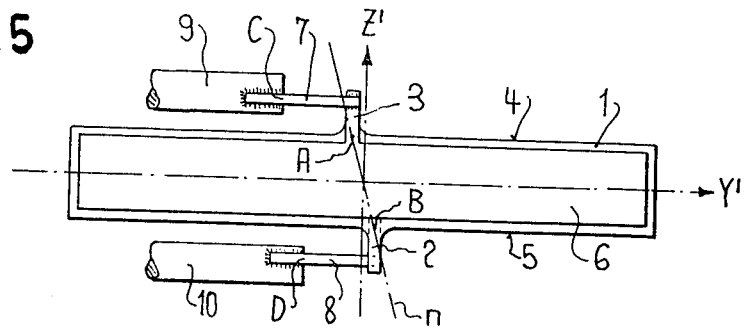

FIG. 5 shows a first embodiment of a resonator according to the invention, where the rectangular blade 1 is cut out of a piezoelectric material with the axes Y' and Z' disposed as indicated in FIG. 1. Rectilinear segments 2 and 3, perpendicular to the lateral sides 4 and 5 of the blade 1 are cut at the same time as the blade out of the same plate of piezoelectric material. The longitudinal axis of the segments 2 and 3 are thus disposed on each side of the Z'-axis and they have the same thickness than the blade 1. A thin metallic layer 6 is deposited upon each of the great sides of the blade 1, thus forming the excitation electrodes. Their extension on the arms 2 and 3 ensure the electrical connection with an oscillator circuit. Moreover, the thin layers are also used for the soldering of two of the ends of resilient and metallic rods 7 and 8 disposed in parallel to the great sides of the blade 1. The other ends of the rods are fixed, for example by soldering, on stiff supports 9 and 10 (electrically isolated from each other) which are part of a base which is not shown.

The rod 7 is soldered on the metallization of one of the sides, the rods on the metallization of the other side.

The rods 7 and 8 are put into motion by the second coupled mode of transversal extensional vibration and are only subjected to pure flexion. One may consider them like girders embedded in C and D and their length is determined in such a way that these latter points will coincide with nodes of the vibration. The coupled tranversal vibration as well as the two other modes of vibration are therefore not damped by the suspension arms. Therefore, such a suspension of the blade does not give rise to any decrease of the quality factor of the resonator. The rods 7 and 8 ensure also the electrical connection between the electrodes and the associated electronic circuit. This embodiment is particularly well impact-resistant.

Figure 6:
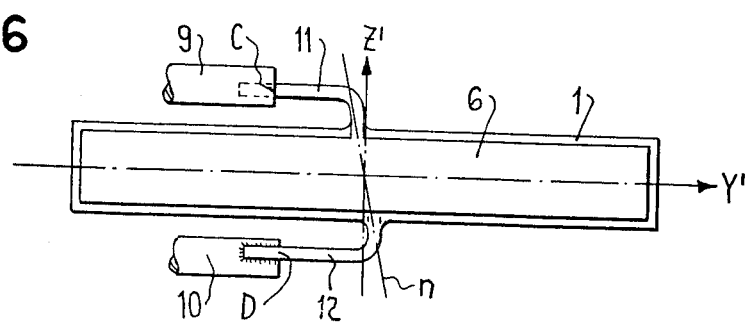

FIG. 6 shows another embodiment of the invention in which the whole arms 11 and 12 are integral parts of the plate 1 (the aggregate plate-arms is thus a monolithic one). Like in the precedent embodiment, the metallization of the sides, which is forming the electrodes of excitation, is extended to the suspension arms which are directly soldered to the stiff support 9 and 10. Each of the arms comprises a first segment perpendicular to one of the lateral sides and a second segment of greater length extending in a direction parallel to the lateral side of the blade.

Again, the length of the segments is determined in such a way that the flexure mode of vibration of these parts is not damped. The metallic layer supported by the suspension arms ensure also the electrical connection between the electrodes and the associated circuit.

Figure 7:
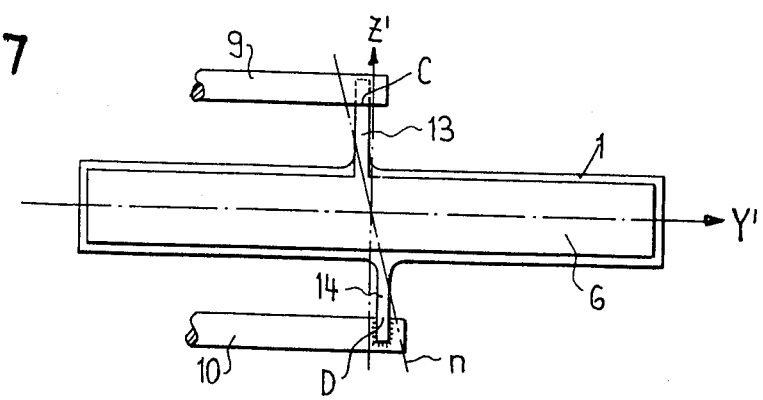

In the embodiment of FIG. 7, the arms 13 and 14 are again integral parts of the plate 1, each of them comprising only one part parallel to the Z'-axis. They are put into an extensional vibration mode by the coupled transversal extensional vibration of the resonator. Again, one may consider them like girders embedded in C and D and their length is calculated in such a way that these latter points coincide with nodes of the vibration. In this way, the vibration of the resonator is not damped.

Figure 8:
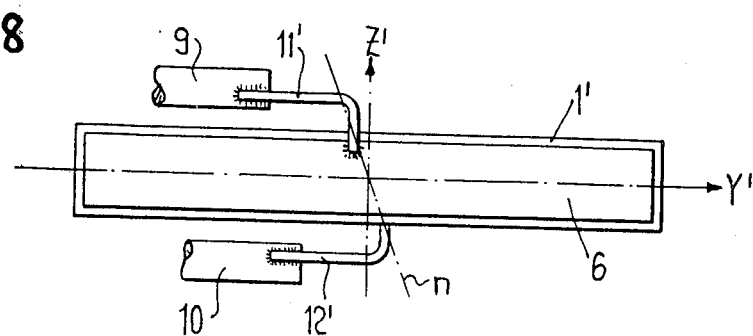

FIG. 8 shows a simplified embodiment where the resonator comprises a rectangular blade 1' provided with metallic layers 6 on its great sides and two arms formed by bent metallic rods 11' and 12', one of the ends of each of these arms being directly soldered upon one of the layers 6 and the other upon one of the stiff supports 9 and 10.

The described embodiments are particularly well suited to be batch-manufactured, above all when the resonators are of small dimensions and when the thickness of the plates out of which they are cut is weak, in the order of a few hundreths to a few tenths of a millimeter. Such a production can be done by using masking and chemical etching techniques for the cutting out of the blades and of their arms and techniques of metallization under vacuum for the electrodes 6 and the conducting parts deposited on the arms. These various techniques are currently used in the field of the microelectronic and are well known.

In all of the above described embodiments the fixing of the arms to the stiff supports 9 and 10 is done by soldering. The solder material is mostly tin and is therefore relatively soft. For that reason, the fixing is not stiff enough to be regarded as a good embeddement.

Figure 9:
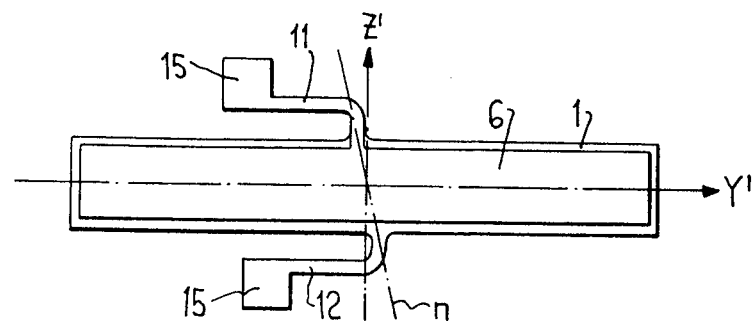

FIG. 9 shows an improvement which can also be applied to the embodiments of FIGS. 6 and 7. The arms 11 and 12, which are similar to those of FIG. 6, are terminated by a part that is wider than the suspension arms themselves. Such a change of width modifies the acoustic impedance of the arm and determines an embeddement which is pratically ideal. The position of the widening and therefore also the position of the embeddement can be determined with accuracy and it is easily reproducible during a batch-production. This would not be the case if the arms were fixed by soldering.

The parts 15 are metallized as well as the other part of the arms and they are soldered to the stiff supports in a conventional way. The position and the composition of the solder are no more important factors and there is no more any risk of a decrease of the quality factor of the resonator.

Figure 10:
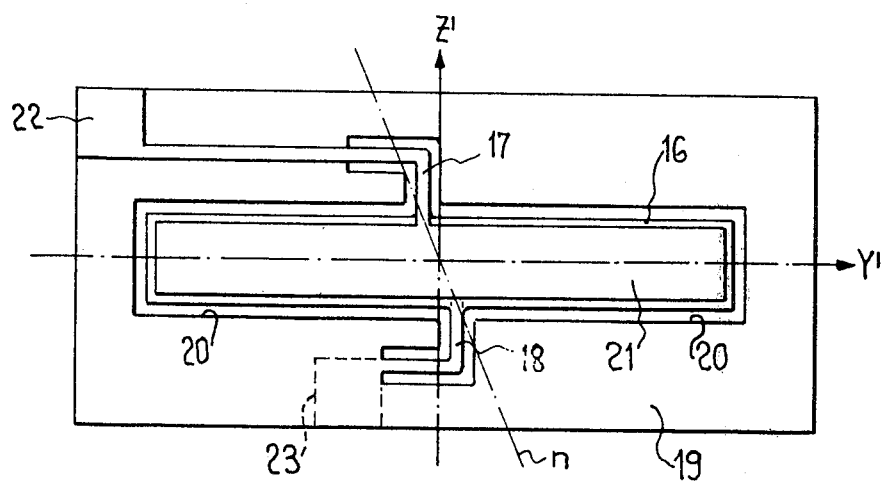

The embodiment of FIG. 10 joins the advantages of the present invention and those of the published Swiss Application No. 12 124/75.

The blade 16, the arms 17 and 18 and the stiff base 19 of this embodiment form a monolithic aggregate and are obtained by chemical machining of the slots 20 in a plate having greater dimensions than those of the resonator part with its arms. The electrodes 21, the electrical connections supported by the suspension arms and the terminals 22 and 23 are obtained by only one operation of metallization made simultaneously on both sides of the plate.

It should be observed that in all of the above described embodiments of the present invention, the width of the suspension arms at the place where they are attached to the blade, only plays a secondary part. Theoretical study and experience have shown that if the width in question is not greater than 1/10th of the length of the blade, there is not any cause for the vibration to be damped.

The possible embodiments of the present invention are not limited to those described above. The active part of the resonator, the suspensions arms and the stiff supports may have different shapes or absolute or relative dimensions without going beyond the frame of the invention. More particularly, the arms may form with the Y'-axis an angle different from 90°; they may, for example, be attached to the blade in the direct extension of the nodal line n.

We claim:

1. A microresonator comprising a flat resonant part and two suspension arms disposed in a plane parallel to the plane of said resonant part, one of the ends of each of said arms being adapted to be fixed on a stiff support and said resonant part being provided on its two principal sides with electrodes to stimulate the vibrations, said electrodes being extended by connection leads associated to said arms, said resonant part being cut from a piezoelectric material so as to oscillate according to a vibration resulting from the superposition of a principal extensional longitudinal mode of oscillation, said resonant part also being subjected to a first shear coupled mode of oscillation and a second extensional transversal coupled mode of oscillation, said resonant part being attached to said arms approximately at the point of intersection of a nodal plane of the vibration resulting of the superposition of said principal mode and said first coupled mode with lateral sides of said resonant part, so that said arms are only bound to vibrate according to said second coupled mode of oscillation, said arms being fixed on said stiff support at a node of said vibration of said arms.

2. Microresonator according to claim 1, wherein at least one part of said arms is cut out at the same time and of the same plate of piezoelectric material as said resonant part.

3. Microresonator according to claim 2, wherein said resonant part is a rectangular blade, said principal extensional mode of vibration being longitudinal and said second coupled mode being a transversal mode.

4. Microresonator according to claim 3, wherein each of said arms comprises a first segment perpendicular to one of the lateral sides of said blade and a second segment parallel to said lateral side, said second segment also cut out at the same time and of the same plate of piezoelectric material as said resonant part.

5. Microresonator according to claim 3, wherein each of said arms comprises a first segment perpendicular to one of the lateral sides of said blade and a second segment formed by a resilient-metallic rod whose one end is fixed perpendicularly to the end of said first segment.

6. Microresonator according to claim 3, wherein each of said arms comprises a segment perpendicular to one of the lateral sides of said blade, the end of said segment being capable to be fixed to said stiff support.

7. Microresonator according to one of the claims 4 or 6, wherein each of said arms comprises, at its end capable to be fixed to said stiff support, a part with a greater width provided in order to improve to embeddement of said ends of the arms.

8. Microresonator according to claim 3, wherein said arms have a width smaller than one tenth of the length of said blade.

9. Microresonator according to claim 3, wherein said electrodes and said electrical connections are deposited at the same time during a process of metallization, at least on one of the great sides of said blade and on one of said arms.

10. Microresonator according to claim 3, wherein said blade is cut out of a plate of piezoelectric material in such a way that the great sides of said blade are perpendicular to the electric X-axis of said material, when the width of said blade is forming an angle $\theta$ with regard to the direction of the optical axis Z.

* * * * *